(12) United States Patent
Bilas et al.

(10) Patent No.: US 6,708,124 B2
(45) Date of Patent: Mar. 16, 2004

(54) IMPULSIVE TRANSIENT DETECTION AND DATA ACQUISITION COPROCESSOR

(75) Inventors: Ronald J. Bilas, Murfreesboro, TN (US); Avery D. Long, Lavergne, TN (US); M. Jason Thurmond, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 157 days.

(21) Appl. No.: 09/824,414

(22) Filed: Apr. 2, 2001

(65) Prior Publication Data

US 2003/0018441 A1 Jan. 23, 2003

(51) Int. Cl.[7] ............... G01R 21/00; H02H 3/22
(52) U.S. Cl. ............... 702/61; 702/58; 324/512; 361/111
(58) Field of Search ............... 702/57–62, 64–66, 702/80, 117, 124, 126, 176, 182, 184, 185, 187–189; 324/512, 522, 103 P; 361/86, 90, 91.1, 111, 118

(56) References Cited

U.S. PATENT DOCUMENTS 3,893,060 A * 7/1975 Balser ............... 367/113
4,727,314 A * 2/1988 Lapeyrolerie et al. ...... 324/102
6,334,175 B1 * 12/2001 Chih ............... 711/170
6,424,927 B1 * 7/2002 Sechi et al. ............... 702/126

OTHER PUBLICATIONS

"Powerlogic® Advanced Power Reliability Solutions," Square D Schneider Electric, brochure, 2000, 3 pages doublesided.
"Powerlogic® Circuit Monitor—Series 2000," Square D Schneider Electric, brochure, 3 pages doublesided.
"Powerlogic® Power Meter," Square D Schneider Electric, brochure, 1998, 2 pages doublesided.
"Powerlogic® Metering & Monitoring Devices," Square D Schneider Electric, brochure, 2000, 2 pages doublesided.
"Powerlogic® Power Monitoring and Control System," Square D Schneider Electric, brochure, 1998, 4 pages doublesided.
"Powerlogic® Series 4000 Circuit Monitor," Square D Schneider Electric, brochure, 2000, 3 pages doublesided.

* cited by examiner

Primary Examiner—Marc S. Hoff
Assistant Examiner—Manuel L. Barbee
(74) Attorney, Agent, or Firm—Larry I. Golden (57) ABSTRACT

An impulsive transient detection and data acquisition coprocessor for use with a power monitoring device having a processor for performing data sampling and reporting at a given rate. The coprocessor has a processor, an interface for accessing data from the processor, a plurality of channels for monitoring for transients, and at least two independent, switchable memory banks for simultaneous real-time storage and analyses of an incoming transient data stream.

27 Claims, 2 Drawing Sheets

IMPULSIVE TRANSIENT DETECTION AND DATA ACQUISITION COPROCESSOR

BACKGROUND OF THE INVENTION

High voltage transients can degrade power systems. The high data rates required in transient detection are too fast for current microprocessors to handle by themselves and still perform other data sampling and reporting functions at the desired rate. The occurrence of these transients is often intermittent and unpredictable.

The Transient-Current-Voltage (TCV) Module of the invention solves the problem of unattended detection, storage, and analysis of these transients. The Acquire/Trigger/Control/Interface (ATCI) chip is a component of the TCV and makes the TCV possible. When used in a system with a general purpose microprocessor, the ATCI chip makes possible the continuous real-time detection and storage of high voltage transients on any of three independent channels. The "plug-in" nature of the module makes it easy for the customer to upgrade an existing current-voltage monitor (CVM) with a TCV by simply replacing the module and downloading the main meter firmware.

Square D, the assignee, currently manufactures a CVM, known as CM4 meter. This invention adds transient analysis capability to an existing CM4 meter in a small, relatively low cost plug-in module and enhances the functionality of the CM4. It allows the customer to add transient analysis to the CM4 by simply purchasing the module and upgrading the CM4 firmware. It provides transient analysis capability to customers at significantly lower cost than competitive offerings. The CM4 can analyze data at a rate of 512 samples/cycle. The TCV can analyze data at a rate of 83,333 samples/cycle. Any customer who wants high speed transient analysis in addition to the present low speed analysis can use the TCV.

The TCV makes high-speed transient detection and storage possible as follows:

1. Provides an interface to a general purpose microprocessor for accessing data and status.
2. Detects transients on any combination of three channels by means of a user programmable voltage/duration triggering mechanism.
3. Uses two independent, switchable memory banks to allow continuous and simultaneous real-time storage and analysis of an incoming transient data stream. Real-time raw data is continuously loaded into one bank of memory while the general-purpose microprocessor simultaneously analyzes the previously acquired data in the other bank with no interruption in the incoming data stream. The two memory banks can be switched on command from the general purpose microprocessor and the roles of the memory banks reversed with no data loss. This technique allows long transients to be analyzed with no loss of data.
4. Provides memory storage for multiple trigger pickup and dropout points. This greatly speeds processing of the incoming transients.
5. Provides a First-In-First-Out (FIFO) and necessary handshake and control for communication with the main monitor.

SUMMARY OF THE INVENTION

Briefly, in accordance with the foregoing, an impulsive transient detection and data acquisition apparatus is provided for use with a power monitoring device having a processor for performing data sampling and reporting at a given rate. The coprocessor comprises a processor, an interface for accessing data from said processor, a plurality of channels for monitoring for transients and at least two independent, switchable memory banks for simultaneous real-time storage and analyses of an incoming transient data stream.

In another embodiment of the invention, a method of monitoring a power system to detect transient events, said monitoring method comprises accessing data from a processor, monitoring for transients, and performing simultaneous real-time storage and analyses of an incoming transient data stream using at least two independent, switchable memory banks.

In another embodiment of the invention, an impulsive transient detection and data acquisition apparatus for use with a power monitoring device having a processor for performing data sampling and reporting at a given rate, said coprocessor comprises means for processing data, interface means for accessing data from said processing means, means for monitoring for transients in a plurality of channels, and at least two independent, switchable means for simultaneous real-time storage and analyses of an incoming transient data stream.

DETAILED DESCRIPTION OF THE ILLUSTRATED EMBODIMENT

The TCV (transient/current/voltage) module is enhanced plug in replacement for an existing 512 samples/cycle CV (current/voltage) module. It offers a much faster, five samples/sec sampling rate for each of three voltage channels and can capture and process voltage transients of up to ±5000 volts. This permits the capture of fast transients that are far beyond the capabilities of the present CV module. In addition to this high-speed capture, low speed 512 samples/cycle circuitry will also be included in the module for high accuracy measurement and compatibility with the present CM4 power monitor made by Square D Company, the assignee.

A fast DSP processor with hardware floating-point capability is used for fast transient analysis and is also available for future enhancements Both the slow and fast sampled data are available to the DSP so it can offload the main unit Coldfire processor or perform functions beyond the capabilities of the Coldfire if desired.

The TCV module includes (see FIG. 1) a high speed Acquire/Trigger/Control/Interface (ATCI) chip 10 and a 60 Mhz ADI Sharc DSP and associated memory 12, (e.g., Analog Devices ADSP 2106x).

Figure 1:
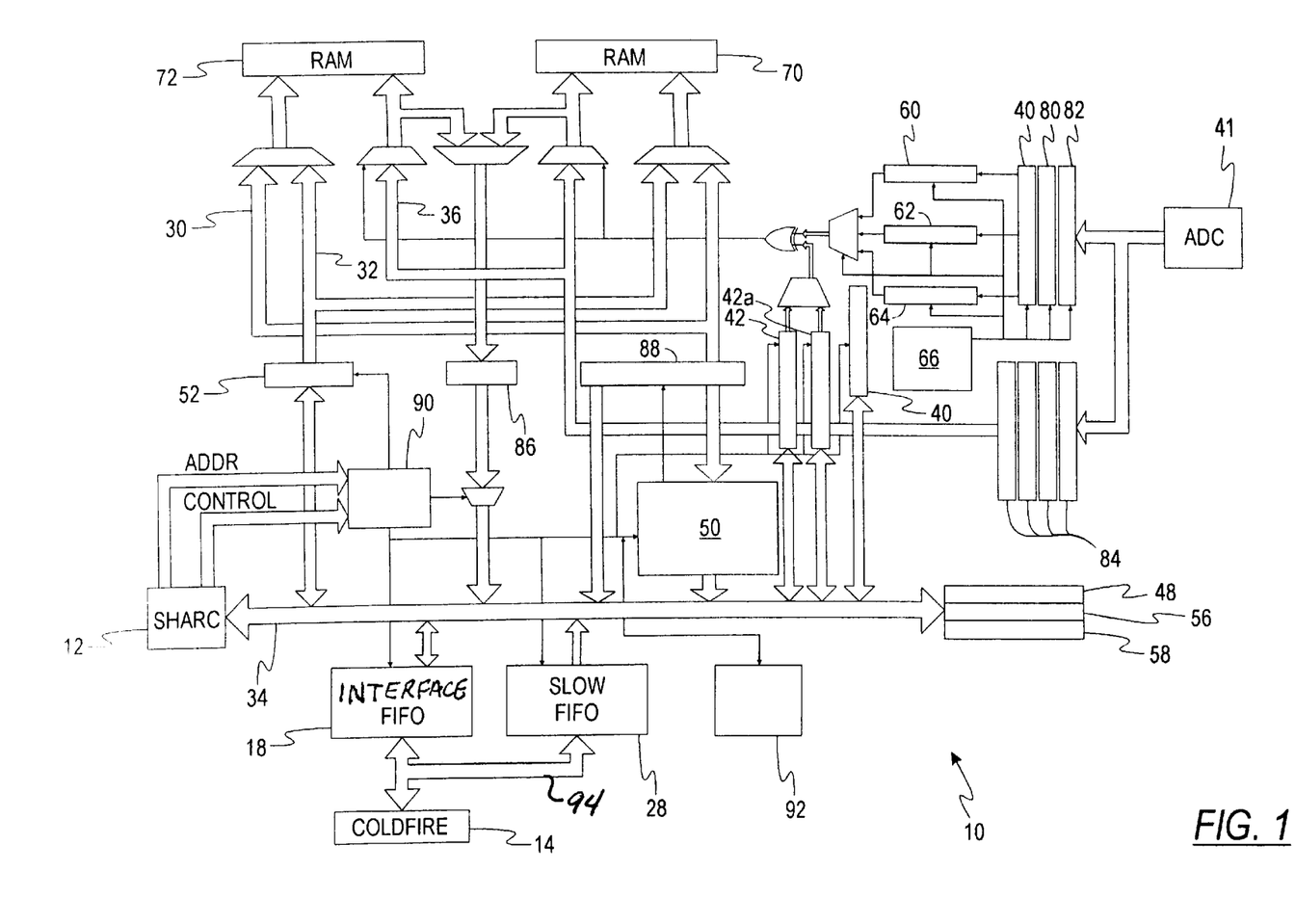
FIG. 1 is a block design of one embodiment of a transient.

The TCV RESET signal is the first signal that should be mentioned when interfacing the TCV to the main meter of the CM4 (not shown). A Coldfire processor 14, which is part of the CM4 device, may be a Motorola 5307 processor, can hard reset the TCV by writing anything to Coldfire address 0x5060000C. Although the TCV has its own power on reset circuitry, this gives the Coldfire the option of resetting the TCV at any time.

In simplest terms the TCV module is a coprocessor for the main meter. Communications to and from the main meter are accomplished through a 768 word FIFO. From the CM4's Coldfire processor, this FIFO is accessible through Coldfire address 0x50600014. Several handshaking signals are provided to arbitrate access to the common bus. These signals insure that only the main meter or the TCV have access to the common interface bus at any given time.

A general description of the protocol used to access the Interface FIFO can be found in the Bus Interface FIFO Control Protocol section. A table of Coldfire Addresses used to interface with the TCV module is shown below in Table 1.

TABLE 1

Coldfire Addresses

| COLDFIRE ADDRESS | FUNCTION | DESCRIPTION |
| --- | --- | --- |
| 0x50600006: bit 3 | TCV owns FIFO | Read: '1' ⇒ TCV controls Interface FIFO<br>Read '0' ⇒ Coldfire controls Interface FIFO |
| 0x50600006: bit 2 | TCV FIFO empty | Read: '0' ⇒ TCV Interface FIFO is empty |
| 0x50600014 | Interface FIFO | Read/Write: TCV Interface FIFO |
| 0x5060000C | Reset TCV | Write: Hard reset TCV |

ATCI Chip
Bus size: 16 bits
Chip select: MS1
Address range: 0x1000000–0x100000B
Read/Write A simplified block diagram of the Acquire/Trigger/Control/Interface (ATCI) chip is shown in the ATCI Chip Block Diagram (FIG. 1). All data movement between the high-speed A/D converters (ADC) 41, the Sharc 12, and the Coldfire 14 are either directly controlled by or channeled through the Acquire/Trigger/Control/Interface (ATCI) chip. All three ATCI data busses 34, 36, 94 can be operated simultaneously. In addition, the ATCI performs triggering calculations that alert the Sharc through an interrupt that a preprogrammed trigger condition has been met. Two ATCI Acquisition RAM address busses 30 and 32 are also shown in FIG. 1.

The ATCI performs six major functions:

1. Transfer data from the A/D converters to acquisition memory,
2. Provide Sharc access to acquisition memory,
3. Calculate trigger for each incoming data word and interrupt Sharc if trigger threshold is exceeded,
4. Provide acquisition DRAM access and refresh control,
5. Provide an Interface between the Sharc and Coldfire via an Interface FIFO 18,
6. Provide a FIFO 28 for storing low speed (512 samples/cycle) data for use by the Sharc
7. Registers The ATCI contains twelve registers. Control and system status information is available through these registers. The addresses and a short description of each register is shown in the Table 2. Detailed descriptions of each follow:

TABLE 2

ATCI Registers

| Register | Address | Description |
| --- | --- | --- |
| Counter Threshold (42) | 0x1000000 | Low going counter threshold trigger set point |
| Counter Threshold (42a) | 0x1000001 | High going counter threshold trigger set point |
| Acquire Memory | 0x1000002 | Sharc access to acquire memory (Read only) |

TABLE 2-continued

ATCI Registers

| Register | Address | Description |
| --- | --- | --- |
| Interface FIFO (18) | 0x1000003 | Sharc access to Coldfire/Sharc Interface FIFO |
| Status Register (48) | 0x1000004 | Status |
| Threshold FIFO (50) | 0x1000005 | Trigger threshold FIFO |
| Acquire Memory Pointer (52) | 0x1000006 | Points to acquire memory address to read |
| Acquire Memory MSW | 0x1000007 | MS word of current Acquire Memory Counter |
| Switch Point (56) | 0x1000008 | Address of last memory switch point |
| Slow ADC FIFO (28) | 0x1000009 | 8 word FIFO containing slow A/D data |
| Status Register 2 (48) | 0x100000a | Second status register |
| Voltage Threshold (40) | 0x100000b | Voltage trigger set point |

Counter Threshold
Register (Low going)
Register size: 12 bits
Address = 0x1000000
Reset value: 0xFFF
Read/Write This register 42 works with the high-going Counter Threshold Register 42a to provide triggering hysteresis. The amount of hysteresis, in the manner shown in FIG. 2, and explained below is determined by the difference in the values placed in the registers—the larger the difference, the larger the hysteresis. The value in each of these registers is compared with the current channel's Duration Counter and trigger conditions are determined from the result. The value in this register will normally contain a number ≦ the value in the high-going Counter Threshold Register The values can be equal. This will result in no hysteresis. A flow chart of the counter threshold operation is shown in this section. The trigger bit is the least significant bit of the 13-bit word read from acquisition memory. As shown in the diagram (FIG. 2) that only positive going crossings cause a Trigger IRQ.

Figure 2:
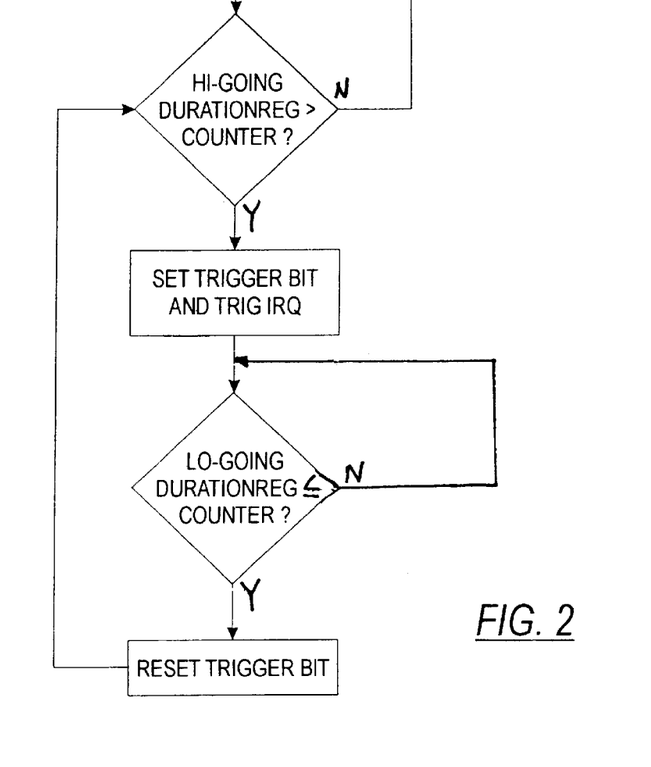
FIG. 2 is a logic flow diagram of threshold trigger point operation.

Counter Threshold Register (High Going)
Register size: 12 bits
Address=0x1000001
Reset value: 0xFFF
Read/Write Operation of this 12-bit register 42a is essentially the same as the low-going Counter Threshold Register 42 explained above except that the sense is positive instead of negative. This register contains the value of the positive-going count required to enable the trigger bit and trigger the Trigger IRQ. When the threshold is exceeded, the next count of the Duration Counter (see below) will be compared to the low-going Counter Threshold Register 42 and thus provide the Schmidt trigger action required to prevent extraneous triggers around the threshold. Each of the three channels operates independently of the others and each transition voltage is compared on a "per channel" basis.

The Trigger IRQ is edge triggered. When the value of the Duration Counter (see below) changes from equal to or greater-than the Voltage Threshold Register, the interrupt will occur. Only a "positive going" threshold crossing will cause an interrupt. Going from a value above the threshold to a value equal or below the threshold will not. At the same time that the IRQ occurs, the trigger address is also written into the Threshold FIFO Register.

Duration Counter Operation.

Three 12 bit counters 60, 62, 64 (one for each voltage channel) are in the ATCI for the purpose of measuring the length of time it takes a transient to reach the voltage level set in the Voltage Threshold register 40. Each counter is completely independent from the others and measures only the duration of its assigned voltage channel. As data streams in from the high-speed A/D converters the three channels are addressed in a round robin fashion. Each counter is only addressed when its associated voltage data point is available.

If the absolute value of a voltage data point exceeds the value present in the Voltage Threshold Register 40 and a trigger point has just been reached because the count in the counter exceeds the value in the high-going Counter Threshold Register, the counter will stop counting and hold its count until the A/D converter data is less than the voltage value loaded into the Voltage Threshold Register. Also, when the threshold has just exceeded the value in the high-going Counter Threshold Register, the channel's counter will now begin to be compared with the value in the low-going Counter Threshold Register to provide hysteresis and prevent unwanted triggers. So long as the A/D voltage is≦the Voltage Threshold Register, the counter will continue counting down until it reaches 0x000 or another positive-going threshold crossing causes it to begin counting up again. (Counting will also stop if the count value reaches 0xFFF when counting up).

Trigger Point Operation (See FIG. 2):

When any of the counters crosses the high-going Counter Threshold Register 42 threshold, a Trigger IRQ will occur (if enabled) and a '1' will be placed in acquisition memory at the same address where the trigger occurred. The compare register will also be changed so that subsequent comparisons will be with the low-going Counter Threshold Register (which contains a smaller value). This '1' will now continue to be written into memory every cycle as long as the value of the counter stays above the 12-bit value in the low-going Counter Threshold Register.

Although a '1' will continue to be written into memory, the Trigger IRQ will only occur once when the counter value exceeds the duration threshold. An IRQ only occurs on positive going threshold crossings.

Triggering:

The time that an incoming voltage channel spends above the voltage threshold determines whether the ATCI will signal a trigger condition. In simplest terms, any incoming voltage sample stream that spends a programmed amount of time above a programmed voltage threshold will cause a trigger. Since the incoming voltage stream is AC, the absolute value of each voltage sample point is compared with the value in the Voltage Threshold Register to determine if that point has been reached. Using the absolute value causes loss of the sign bit in the Voltage Threshold Register 40, thus the register size is 11 bits.

Due to the high data rate, the ATCI breaks up the required trigger calculation into pieces that operate in parallel by employing a pipelined architecture. Although the ATCI is running at 30 MHz, the 15 MHz data rate is too high for the required calculation to finish in a single cycle (the sample rate for each channel is 5 MHz but three channels are sampled in each sample period, thus the 15 MHz data rate). The data in the acquisition memory, the trigger event, and all other high-speed A/D related events are not available until they have been processed through the ATCI pipeline. This delay time is five Sharc 12 clock cycles or 167 ns. The A/D converters have an additional time delay of approximately ten 200 ns periods (2 $\mu$s) from the time the analog signal appears at the A/D input until it reaches the digital output of the A/D. For synchronization purposes, this total 2.17 $\mu$s delay is not significant when compared to the 32.5 $\mu$s sample time of the Coldfire 14.

The ATCI pipeline must be full in order for it to operate at full speed; however, after the first five cycles, the pipeline will always be full. No "fill-time" penalty time is incurred even after a memory switch. The chip will operate at full speed and process and fill the acquisition memory with high-speed A/D converter data at the ATCI's peak rate. After initial power-up, the only other time that the 167 ns "fill-time" penalty will be incurred is if the acquire process is stopped by clearing the EnAqr Bit. When this bit is next set it will take 167 ns for valid data to start appearing again.

Acquire Memory Register44
Bus size: 16 bits:
bits 15-1=bipolar voltage
bit 0=trigger bit,
Address=0x1000002
Read only This read-only register 44 is used by the Sharc 12 to access the acquire memory. Reading this register will transfer the value currently pointed to by the Acquire Memory Pointer register 52 to the Sharc. This register acts as a port into the 1 Mword acquisition memory space. The read/write Acquire Memory Pointer register 52 contains the address of the acquire memory that will be read.

There are no restrictions on the number of words that can be read in a read sequence. After each read the ATCI will increment the Acquire Memory Pointer register according to the rules explained in the Acquisition Memory Addressing section below. When the last memory address (0xFFFFE) is reached, the counter rolls over to 0.

Acquisition Memory Addressing

Due to the high operating speed and the special requirements of dynamic memories, a non-sequential addressing method was devised to address the acquisition memory during acquisition of the A/D voltage data. This is a result of the high-speed nature of the data acquisition and required a specialized address counter. To keep things as simple as possible, a copy of the same counter was used on the Sharc side of the acquisition as on the A/D converter side. The Sharc 12 can therefore read the memory sequentially and store the data into its memory using simple linear reads.

The ATCI can simultaneously address two completely independent DRAM's 70, 72. Under normal operating conditions, one of these memories will be in its acquisition mode and one will be available for reading by the Sharc. Setting or clearing the Ram Select Bit in the status register can change the role of each memory. This is in fact the driving force behind the design of the acquisition system. By switching the roles of the memories, the Sharc can read and process the recently acquired data while the system simultaneously collects new data without any loss.

In order for the system speed requirements and the DRAM refresh requirements to be simultaneously met, an addressing scheme that skips every 16th address was used. This also solved the data alignment problems resulting from the fact that there are three acquired data points, rather than a "power of two".

The counting sequence for the ATCI address counters follows:

0x0, 0x1, 0x2, . . . 0xd, 0xe, 0x10, 0x11, . . . 0xffffd, 0xffffe, 0x0, 0x1, 0x2, . . .

One of the benefits of this counting scheme is that the address of any voltage channel can be easily found by looking at the least significant nibble of the address bits. The remainder of dividing the least significant nibble by three will always point to Va, Vb, or Vc as defined by the following rules:

Absolute Trigger Mode

If (LsAddrNibble % 3=0) LsAddrNibble→Va

If (LsAddrNibble % 3=1) LsAddrNibble→Vb

If (LsAddrNibble % 3=2) LsAddrNibble→Vc

Differential Trigger Mode

If (LsAddrNibble % 3=0) LsAddrNibble→Va−Vb

If (LsAddrNibble % 3=1) LsAddrNibble→Vb−Vc

If (LsAddrNibble % 3=2) LsAddrNibble→Vc−Va

The end result of all of this is that every 16th memory word is lost and each 1,048K word memory device turns into a 983K word memory device—a loss of 65K words. It also makes the calculation of time between two data points a bit more complicated. Instead of just subtracting you now have a more complicated algorithm to go through. This becomes important when trying to determine the time between two data points as might be used to find the time a waveform spends above threshold, for example.

The following is one version of how one might find the time difference between two addresses A1 and A2.

$$\Delta A = \left(A_1 - \frac{A_1}{16}\right) - \left(A_2 - \frac{A_2}{16}\right)$$

Or, using shifts, $$\Delta A = A1 - (A1 >> 4) - [A2 - (A2 >> 4)] \quad (1)$$

Since three voltage samples are read every 200 ns the time between samples is 66.6667 ns. This is not precise, (see below) but for the purposes of this calculation we'll assume the calculation still works. The time between the two points can be obtained as follows:

$$\Delta t = \Delta A * 66.66667 ns$$

A further complication arises as a result of rollover. So, if the number is negative:

$$\Delta t = 0xF0000 + \Delta t$$

This give the time difference between any two data points but in reality, all time stamps are the same for each voltage triplet Va, Vb, and Vc. This fact can be used to find the exact time between two data points without resorting to floating point arithmetic.

The three voltages are not really 66.6667 ns apart; Vb and Vc share the same time stamp as the Va that immediately precedes them. Equation (1) can be modified to reflect this. In equation (2), the terms [Ax−(Ax>>4)]/3 will always be exact and have no remainder.

$$\Delta t = \{[A1 - (A1 >> 4)]/3 - [A2 - (A2 >> 4)]/3\} * 200 \text{ ns} \quad (2)$$

If a rollover occurs, then the same logic applies as in the previous calculation except that the 0xF0000 term must be changed to 0x50000 since everything was divided by 3. The time difference then becomes $$\Delta t = 0x50000 + \Delta t$$

The above section applies only to ATCI addressing. The Sharc 12 reads the data in the acquisition memory through Acquire Memory Register port. The ATCI increments automatically and requires no intervention from the Sharc 12. Once the data is in Sharc (12) memory, however, it will look like a contiguous array and none of the above rules apply. The data is stored in contiguous memory addresses with no skipped addresses. Since the Acquire Memory Pointer is only 16 bits wide, the least significant four bits of the 20-bit memory address are cleared when the pointer is written. This means that Va will always be the first channel read from acquisition memory (Va−Vb in differential mode).

The Threshold FIFO 50 contains 16-bit addresses that suggest a simpler method of finding the difference between any two points contained in it. Each count in this FIFO 50 represents 1 $\mu$s. There will be 15 data points within each count but this is probably more resolution than needed for most cases. The time difference between any two data points separated by more than 1 $\mu$s can be quickly determined to within 1 $\mu$s by simply linearly subtracting the values in the 16-bit Threshold FIFO. This will probably adequate for most purposes and avoids the problem of having to account for skipping every 16th word.

Interface FIFO Register 18

16 bits

Address=0x1000003

Read/Write

This register is used for all communications with the main Coldfire processor 14. It serves as a port into a 768*16 FIFO 18 that is used for all Coldfire/Sharc communications. A software protocol is used to define the messages used in the communications.

Hardware arbitration insures that only the Coldfire 14 or the Sharc 12 have control of this FIFO 18 at any given time. Several status bits are used to request and determine which processor has control of the FIFO 18.

An explanation of the arbitration for this FIFO is explained in the Bus Interface FIFO Control Protocol section.

Status Register 48
Register size: 16 bits
Address=0x1000004
Read/Write

This is one of two status registers and contains various status bits used in the operation of the ATCI. A table of these bits is shown below:

interrupts. When the Status Register is written the software must be sure that a '1' is written to any of these bits that is not meant to be cleared or pending interrupts may be inadvertently cleared. A '1' cannot cause an interrupt but a '0' always clears an interrupt.

Signal Coldfire Bit A
Bit: 15
Read/Write

TABLE 3

ATCI Status Bits

| Bit # | Name | Read/Write | Description |
|---|---|---|---|
| 15 | Signal Coldifre Bit A | R/W | Signal Coldfire that trigger has occurred |
| 14 | Signal Coldfire Bit B | R/W | Alternate Coldfire signal bit |
| 13 | Ram Select Bit | R/W | Select acquire memory for Sharc to read |
| 12 | EnAqr | R/W | Enable data acquisition |
| 11 | DoDiff | R/W | Select difference or raw data mode |
| 10 | Slow ADC FIFO full | Read only | Signals Slow ADC 8-word FIFO full |
| 9 | CVown Bus | Read only | '1' means Sharc controls Interface FIFO |
| 8 | IfceFIFOempty | Read only | '1' means the Interface FIFO is empty |
| 7 | IfceFIFOfull | Read only | '1' means the Interface FIFO is full |
| 6 | EnVaCtr | R/W | Enable/clear channel A threshold counter |
| 5 | EnVbCtr | R/W | Enable/clear channel B threshold counter |
| 4 | EnVcCtr | R/W | Enable/clear channel C threshold counter |
| 3 | Slow FIFO IRQ | R/W | Read: '1' ⇒ Slow A/D FIFO full IRQ active<br>Read: '0' ⇒ Slow A/D FIFO full IRQ inactive<br>Write: '1' ⇒ Enable Slow A/D FIFO IRQ<br>Write: '0' ⇒ Disable and clear Slow FIFO IRQ |
| 2 | Trigger IRQ Bit | R/W | Read: '1' ⇒ Trigger IRQ has occurred<br>Read '0' ⇒ Trigger IRQ not active<br>Write: '1' ⇒ enter normal IRQ modeno affect<br>Write: '0' ⇒ Clr and disable TrigIRQ, enter Auto IRQ/DMA mode |
| 1 | OwnGoesHiIRQ | R/W | Read. '1' ⇒ CVownsBus ↑ IRQ has occurred<br>Read '0' ⇒ CVownsBus IRQ not active<br>Write: '1' ⇒ no affect<br>Write: '0' ⇒ Clr and disable OwnsGoesHiIRQ |
| 0 | ownGoesLoIRQ | R/W | Read: '1' ⇒ CVownsBus ↓ IRQ has occurred<br>Read '0' ⇒ CVownsBus IRQ not active<br>Write: '1' ⇒ no affect<br>Write: '0' ⇒ Clr and disable OwnsGoesHiIRQ |

TABLE 4

Status Bits at Reset

| Signal Coldfire Bit A | Signal Coldfire Bit B | Ram Select | EnAqr | DoDiff | Slow ADC FIFO full | CVownsBus | IfceFIFOempty |
|---|---|---|---|---|---|---|---|
| 0 | 0 | 1 | 1 | 0 | 0 | 1 | 1 |
| Bit 15 | 14 | 13 | 12 | 11 | 10 | 9 | 8 |

| IfceFIFOfull | EnVaCtr | EnVbCtr | EnVcCtr | Slow FIFO IRQ | Trigger IRQ | OwnGoesHiIRQ | OwnGoesLoIRQ |
|---|---|---|---|---|---|---|---|
| 0 | 0 | 0 | 0 | 0 | 0 | 0 | 0 |
| 7 | 6 | 5 | 4 | 3 | 2 | 1 | 0 |

Writes to the Status Register:

Care must be taken any time that you write to the Status Register to insure that the four least significant bits are not inadvertently cleared. These four bits control interrupts and writing a '0' to any of them will immediately clear any pending interrupts. Since other bits share this register there will be a lot of writes that are not associated with the Status at Reset: '0'

This bit is used to signal the main Coldfire processor 14 that an event has occurred that requires a data transfer through the Interface FIFO 18. The primary purpose of the bit is to signal the Coldfire 14 that a trigger event has occurred, though the bit could be used for additional purposes. This bit is under Sharc 12 software control and can be used for any purpose. Setting this bit sets bit 15 of the slow A/D data as the Coldfire DMA reads it. This can be used as a sync point to signal when the event occurred in the slow A/D data stream.

Writing to this bit does not directly update the data that goes to the Coldfire 14 It should be considered as a request to update. Actual writing of the bit that the Coldfie 14 reads is done during the first read pulse of the Coldfire 8-word slow ADC read sequence. Since the Sharc will immediately read the same data after the Slow ADC FIFO is filled, the data going to the Coldfire 14 will match the Sharc 12 data. Because of this delay, there can be up to a 32 us delay between when the bit is requested to change and when it actually changes.

Signal Coldfire Bit B

Bit: 14

Read/Write

Status at Reset: '0'

This bit is a general purpose bit that can be used to signal the Coldfire 14 for any purpose. It's not synchronized like Signal Coldfire Bit A so care must be used if synchronization is required.

Ram Select Bit

Bit: 13

Read/Write

Status at Reset: '1'

The Ram Select Bit selects which acquisition DRAM 70, 72 is connected to the Sharc 12. A '1' selects one of the memories to be connected to the Sharc while the other continuously acquires data from the fast A/D converters. A '0' interchanges the function of each memory. The two acquisition memories are functionally equivalent and it doesn't matter which one is actively acquiring data and which one is available for reading by the Sharc.

All that is required to interchange the two acquisition memories is to invert this bit. A write to this bit does not actually do the switch. It should be considered a request to switch. The switch does not occur immediately after the bit is inverted. It will only occur when the least significant nibble of the acquire memory address counter is a multiple of three. This insures that all three channels will be in the same physical DRAM and not spread across two devices. Also, other things such as a refresh occurring when the switch is requested will delay the actual switch. For this reason it's important to read the Ram Select Bit before accessing the acquisition memory to make sure that the switch has actually occurred. A read of this bit always reflects which memory is connected to the Sharc.

Acquisition Memory Refresh

As noted earlier, the acquisition memory uses dynamic memory devices 70, 72. They offer much higher density at a much lower cost than any equivalent static memory. However, they require constant refreshing or they will lose their data.

The ATCI 10 takes care of all of this and is usually transparent to the Sharc 12. The only time that the Sharc 12 needs to worry about refresh is during a memory switch.

When the ATCI is transferring data from the high-speed A/D converters to the acquisition memory the technique used is totally different from Sharc accesses to acquisition memory. In order to satisfy the DRAM refresh requirements the two memories 70, 72 are refreshed differently.

The acquisition memory device is refreshed at a rate about 16 times faster than the acquisition memory connected to the Sharc.

The refresh rate of the memory (?) connected to the Sharc 12 is almost (but not quite) twice as fast as it needs to be to meet the memory specification. The memory device attached to the high-speed A/D converters is about 16 times faster than it needs to be.

The key point to remember about refresh is that each row of the acquisition memory must be refreshed at least once every 16 ms. The TCV acquisition memory contains 1024 rows. Each row of the memory connected to the Sharc is refreshed at least once every 8.192 ms (almost twice as fast as the required 16 ms). Each row of the memory connected to the A/D converters is refreshed once every 1.024 ms (slightly less than 16 times as fast as the spec requires).

If the memory is not switched the refresh spec is clearly met. If the memory is switched once the spec will also be met. Assume that row address A is in the memory currently connected to the Sharc and it is the very next location scheduled for refresh. This means that it has not been refreshed for about 8.192 ms. Just before the refresh occurs, the memory is switched so that now A is being controlled by the A/D acquisition circuitry.

Now assume the worst case that the memory counter controlling the A/D acquisition memory just finished refreshing address A before the switch was made. Therefore, when the switch is made, the first row that will be refreshed will be A+1. This means that A cannot expect to be refreshed for another 1.024 ms—the refresh period of the A/D converter side of the acquisition memory. The worst case total maximum time that row address A will have to wait for a refresh will therefore be:

$$t_{max}=8.192\ ms+1.024\ ms$$

$$t_{max}=9.216\ ms$$

This is well below the required 16 ms refresh time. Similar reasoning can be used to show that a row address currently in the Sharc address space will have the same worst-case maximum time if it is switched to the A/D converter address space.

Now consider the case of two memory switches. Waiting longer than 1.024 ms for the second switch will always work because all memory locations in both address spaces are guaranteed to be refreshed in 2.048 ms (time required for two switches).

There are many more complicated scenarios but this is probably the simplest rule to guarantee all rows in both acquisition memories are refreshed:

Make sure that the minimum time between memory switches is greater than 1.024 ms EnAqr Bit Bit: 12

Read/Write

Status at Reset: '1'

The EnAqr bit is used to enable data acquisition from the high-speed A/D converters to the acquisition memory. The ATCI will begin acquiring data immediately after a reset since the default state of this bit at reset is a '1' Normally this bit should never be a '0' but there may be circumstances where it might be useful to stop the acquisition. For example, if a very long capture is desired, one of the acquisitions memories could be allowed to completely fill. Then a memory switch could be commanded and the other memory completely filled. After this memory is completely filled the EnAqr Bit could be cleared, thus stopping acquisition.

This technique would allow storage of very long data streams since the full 2 Mwords of acquisition memory would be in use. 131 ms or over 8 full cycles of high-speed data could be stored in this way.

Like the Ram Select Bit, the EnAqr Bit does not happen immediately. The rules that apply to the Ram Select Bit also apply to the EnAqr Bit DoDiff Bit Bit: 11

Read/Write

Status at Reset: '0'

The DoDiff bit sets the ATCI trigger mode. The ATCI has two triggering modes—absolute and differential. At reset the trigger mode is set to absolute (DoDiff Bit='0'). Absolute trigger mode uses the actual data from the high-speed A/D converters to do its trigger calculation. Differential trigger mode (DoDiff Bit='1') uses the difference between channels to do the calculation. The three differences used are:

Va−Vb

Vb−Vc

Vc−Va

In either mode of operation actual data points directly from the slow speed A/D converters (adjusted to bipolar data) are always placed in the acquisition memory rather than calculated values. For example, even though the trigger calculation might use Vb -Va to determine a trigger point, this calculated value is not placed in the acquisition memory.

Slow ADC FIFO Full Bit

Bit: 10

Read only

Status at Reset: '0'

This bit signals when the 8-word slow A/D FIFO 28 is full. If full, the data must be read before the next Coldfire DMA cycle (within 32 $\mu s$) or the data will be lost.

CVownBus bit

Bit: 9

Read only

Status at Reset: '1'

This bit is used to determine whether the Coldfire 14 or Sharc 12 controls the Interface FIFO 18. An arbitration circuit on the main meter Digital board controls the bit. The arbitration circuit grants control of the Interface FIFO 18 based on which processor requested control first. See the Bus Interface FIFO Control Protocol section below for a description of the operation of the FIFO arbitration circuit IfceFIFOempty bit Bit: 8

Read only

Status at Reset: '1'

This bit is used to determine if the Interface FIFO 18 is empty. A '1' indicates that the FIFO 18 is empty and there is no data to communicate to or from the Coldfire. A '0' indicate that there is data in the FIFO 18. A protocol determines what action needs to be taken.

IfceFIFOfull bit

Bit: 7

Read only

Status at Reset. '1'

This bit is used to determine if the Interface FIFO 18 is full. A '1' indicates the FIFO 18 is full.

EnVaCtr Bit

Bit: 6

Read/Write

Status at Reset: '0'

This bit enables or clears the Va threshold counter. A '0' asynchronously clears the counter and a '1' enables it to count using the triggering algorithm rules. The counter is disabled and reset after a hard reset and must be enabled by software. See Duration Counter Operation for a description of threshold counter operation.

EnVbCtr Bit

Bit: 5

Read/Write

Status at Reset: '0'

This bit enables or clears the voltage channel B threshold counter. A '0' asynchronously clears the counter and a '1' enables it to count using the triggering algorithm rules. The counter is disabled and reset after a hard reset and must be enabled by software. See Duration Counter Operation above for a description of threshold counter operation.

EnVcCtr Bit

Bit: 4

Read/Write

Status at Reset: '0'

This bit enables or clears the voltage channel C threshold counter. A '0' asynchronously clears the counter and a '1' enables it to count using the triggering algorithm rules. The counter is disabled and reset after a hard reset and must be enabled by software. See Duration Counter Operation above for a description of threshold counter operation.

Slow FIFO IRQ bit

Bit: 3

Read/Write

Status at Reset: '0'

The Sharc IRQ2 and DMAR2 pins are shorted together on the PC board. Whether an input stimulus causes a DMA or an IRQ to occur as a result depends on the settings of the Sharc's DMA and IRQ enable bits. The Slow FIFO IRQ Bit is multipurpose and is used to either determine the interrupt status of the Slow ADC FIFO 28 or run DMA sequences. The bit has different meanings depending on whether it was read or written. Normal IRQ operation of the FIFO interrupt occurs when a '1' is written to this bit. In this mode, an interrupt will be sent to the Sharc when the Slow ADC FIFO 28 is filled. Reading a '1' indicates the FIFO is full (contains 8 words) and has caused an interrupt request to be sent to the Sharc. Since this interrupt requires the fastest response time it is not shared with any others but is connected to Sharc IRQ 2 directly. Note that writing a '1' to this bit enables but doesn't cause an interrupt. Reading the bit doesn't read the status of this bit but rather the interrupt status itself Reading a '1' means that a Slow ADC FIFO 28 interrupt has occurred. Reading a '0' means that an interrupt has not occurred.

Although interrupts can be used to transfer data between the Slow ADC FIFO and the Sharc, DMA will accomplish the same thing with much higher efficiency. Setting the Slow FIFO IRQ bit to '0' (default) sets the ATCI to it's Slow ADC FIFO DMA mode. The DMA mode is the preferred mode of operation since it is the least intrusive to Sharc operations. Writing a '0' to the bit both disables and clears the interrupt and causes the ATCI to enter the DMA mode.

In this mode, the data transfer form the ATCI to the Sharc internal data memory is fully automatic after the DMA chain table is loaded and the DMA is started. The DMA transfer will occur without any intervention from the Sharc except for DMA interrupts that will be set in the chain table to allow processing of the data at programmable intervals (See the Sharc User's Manual). Operation proceeds as follows:

Approximately every 32 $\mu s$, the Sharc 12 is required to read in eight words of data from the Slow ADC FIFO 28. This is a continuous high priority requirement regardless of any other tasks that the Sharc may be doing. The overhead required to do this simple data move with an IRQ is very high. A much more efficient way of accomplishing this is to use one of the Sharc's external DMA channels. Sharc external hardware DMA channel 2 (the highest priority external channel) is used for this purpose. For some strange reason, Analog Devices connects hardware DMA channel 2 (DMAR2 pin on the chip) to the external DMA0 variables in the Sharc 'C' definitions macros file. Software wise, the highest priority external DMA channel is '0' and this is the one used for the low speed data DMA.

The ATCI sends eight DMA requests to the Sharc 12 each time the Slow ADC FIFO 28 fills. Each request results in the Sharc reading a word from the FIFO. After eight reads the ATCI terminates any more requests until the next 32 µs boundary.

The Slow ADC FIFO 28 is just like any other memory address and can be read with software. But when used with DMA care must be taken to insure that data is not corrupted. The DMA begins operation when the Slow ADC FIFO fills. From this point, the ATCI will request a new DMA word transfer each time that the Sharc reads the Slow ADC FIFO address (eight times per 32 µs cycle). This will happen whether the read was the result of a software instruction or a DMA transfer. For this reason, software reads of the FIFO must be timed not to interfere with DMA transfers or corrupted data will result.

If it's ever necessary to turn off DMA for a single 32 µs cycle, for example, all setups (enabling interrupts, disabling DMA, etc.) must be accomplished within the 25 µs window of inactivity or corrupted data will result.

To use the DMA mode, set up and enable the Sharc external software DMA channel 0 to "paced master mode". This will allow it to interpret the signals from the ATCI as DMA requests. Also, make sure that Sharc external IRQ 2 is disabled (set to '0' in the Sharc IRQ enable register) and set the Slow FIFO IRQ bit to '0' (default).

Setting up the DMA chain table, starting the DMA, and setting up the memory for short words is not straightforward but I do have code that will accomplish it and have verified that the transfers are very fast and have a higher priority than the other external DMA channel. The Sharc automatically preempts ongoing DMA 1 transfers (such as one that may be ongoing from the ATCI acquisition memory or Interface FIFO) and reads the eight slow speed data words before proceeding with the current DMA 1 transfer.

If the ATCI is not being accessed the transfer speed of all eight words is about 800 ns. If the ATCI is being accessed (such as using DMA 1 to read data from the acquire memory at the same time that DMA 0 is running), the data rate will be a bit slower. Because of the Sharc arbitration scheme, if DMA 1 is running the DMA 1 and DMA 0 transfers are actually interleaved until the eight slow speed data words are completely transferred. But even with the arbitration delays, the transfer of all eight words happens less than 1.5 µs from the time the Slow ADC FIFO is filled. This means that only about 7 or 8 µs is used worst case out of the total of 32 µs to transfer the data from the ATCI to the Sharc internal memory even if the Coldfire DMA transfer time is included. The remaining 24 to 25 µs should be enough to process any DMA related interrupts that are loaded in the DMA chain table.

Using DMA "chaining" any number of 8-word blocks can be loaded into internal memory with no direct program intervention or even knowledge. This is a much more efficient means of moving the data. If done properly, the chaining table can be set up at initialization and left untouched afterwards. DMA IRQ's can be inserted in various parts of the table (every quarter or half cycle, for example) to alert the processor to process the previous data In this mode, the Sharc 12 and ATCI 10 will transparently work together to load the slow ADC data into memory with minimal CPU intervention.

Trigger IRQ Bit

Bit: 2

Read/Write

Status at Reset: '0'

Bit 2 is used to determine if an interrupt caused by a programmed trigger event has occurred Reading a '1' means that a trigger IRQ has occurred. A '0' indicates that a trigger event has not occurred.

Writing to this bit is not completely straightforward.(see Writes to the Status Register section). Writing a '0' to the bit will clear and disable the interrupt. Writing a '1' does not cause an interrupt to occur but enables the hardware to allow an interrupt. This is an important distinction and if the bit is not properly programmed inadvertent loss of interrupts will occur. So in order to be ready for the next interrupt, this bit must first be cleared then set. This IRQ, the OwnGoesHiIRQ, and the OwnGoesLoIRQ all share Sharc IRQ 1 so firmware will have to determine the event that caused the interrupt.

OwnGoesHiIRQ bit

Bit: 1

Read/Write

Status at Reset: '0'

This IRQ is provided to allow the Sharc 12 to process data without continuously polling the CvownBus bit. The Bus Interface FIFO Control Protocol provides a way of using the edges of the CvownBus bit to determine when data can be transmitted or received from the Coldfire. This IRQ could be used to determine when the Coldfire is finished transmitting a message to the Sharc 12. If the Coldfire 14 owns the Interface FIFO, the CvownBus bit will be low and the Sharc 12 will be unable to get control of the bus again until the Coldfire releases it by writing a '1' to its request bit. However, the Sharc can still write a '0' to its Flag 10 bit.

When the Coldfire releases the FIFO this interrupt will fire (if enabled) because the CvownsBus signal will go from low to high signifying that the Sharc now has control of the Interface FIFO.

This IRQ, the Trigger IRQ, and the OwnGoesIRQ all share Sharc IRQ1 so firmware will have to determine the event that caused the interrupt.

OwnGoesLoIRQ bit

Bit 0

Read/Write

Status at Reset: '0'

This IRQ works the same as the OwnGoesHiIRQ but uses the high to low going edge of the CVownBus signal. To use this IRQ the CvownBus bit would initially be a '1' meaning that the Sharc has control of the bus. The Sharc would then set its Flag 10 bit to '1'. This alone would not cause FIFO ownership to change. The Sharc would maintain control of the FIFO until the Coldfire sets its request bit to '0'. This would cause FIFO ownership to change and the CvownBus bit would transition from high to low and cause this IRQ to fire.

At this point the Coldfire would have control of the bus and the Sharc would not have access to the FIFO. It would just signal that the Coldfire is now doing something with the FIFO but isn't finished. The Sharc could use this interrupt to then enable the OwnGoesHiIRQ and set it's request bit to '0'. This would trigger the OwnGoesHiIRQ when the Coldfire is finished using the FIFO.

This IRQ, the Trigger IRQ, and the OwnGoesHiIRQ all share Sharc IRQ 1 so firmware will have to determine the event that caused the interrupt.

Threshold FIFO Register (50)

Bus size: 16 bits

Address=0x1000005

Read only

Every time a transition (either positive going or negative going) through a threshold point defined by the Voltage Threshold Register 40 and the Counter Threshold Registers 42 occurs, an entry is made into this 21×64 Threshold FIFO. An entry is made for each transition, whether it's positive going or negative going Twenty bits of the Threshold FIFO are dedicated to the address where the transition occurred and one bit is dedicated to the direction of the transition—'1' indicates positive going and '0' indicates negative going. Since the ATCI 10 interfaces to the Sharc 12 through a 16-bit bus, the data in the Threshold FIFO 18 is divided into two parts.

This register contains the 16 most significant bits of the 20-bit address contained in the FIFO 50. The least significant four bits of the 20-bit address and some other status about the Threshold FIFO 50 are contained in Status Register 58.

Reading this register 50 automatically increments the FIFO read counter this register is read after Status Register 58 is read (reading Status Register 2 does not increment any FIFO pointers). Placing the 16 bits of an the Threshold FIFO register in bit positions 19 through 4 and then placing bits 3 through 0 of the Status Register 2 into bit positions 3 through 0 of this newly formed long word will result in the 20-bit address of a threshold crossing point in acquisition memory.

Up to 64 threshold crossings can be stored in the Threshold FIFO. Any additional crossings will be lost. The FIFO will not roll over so the original data will not be lost but any additional threshold crossings will.

An example of how this FIFO might be used and how to interpret the addresses stored in the FIFO can be found in the Acquisition Memory Addressing section.

Acquire Memory Pointer Register (52)

Register size: 16 bits

Address=0x1000006

Read/Write

This register 52 contains the most significant 16 bits of the address that will be read the next time the Sharc reads the acquisition memory through the Acquire Memory Register. Since the acquisition memory requires 20 bits to access its full range, this means that the least significant four bits of the address are set to 0x0 when this register is written. Therefore, the starting point for any Sharc read of acquisition memory will always occur on a 15-word boundary. All acquisition memory locations can still be read (subject to the restrictions of the Acquisition Memory Addressing section), but the starting point of each read sequence will always occur on a 15-word boundary.

The counting sequence of this pointer (including the hidden least significant nibble) is shown below:

0x0, 0x1, 0x2, . . . 0xd, 0xe, 0x10, 0x11, 0xfffffd, 0xfffffe, 0x0, 0x1, 0x2, . . .

Acquire Memory MSW Register

Register size: 16 bits

Address=0x1000007

Read only

This register contains the current most significant 16 bits of the acquisition memory counter.

Switch Point Register 56

Register size 16 bits

Address=0x1000008

Read Only

This register 56 contains the least significant 16 bits of the address where a memory switch has actually occurred. The most significant four bits of the address are in bit positions 8 through 5 of Status Register 2. The combination of data from these two sources forms a 20-bit address that points to the first address of acquisition memory loaded by the high-speed A/D converters after a memory switch has occurred.

Slow ADC FIFO Register (28)

Bus size: 16 bits

Bits 15-14: not used by FIFO but read as Coldfire signal bits

Bits 13-0: ADC data

Address=0x1000009

Read only

This register 28 serves as a port into an eight word FIFO that contains the same data as the Coldfire 14 reads from the slow A/D converters. Note that this FIFO is 14 bits wide but the data transferred to the Coldfire from the low-speed A/D converters is 16 bits wide. The two remaining bits (Signal Coldfire Bit A and Signal Coldfire Bit B) are transferred to the Coldfire directly along with the actual 14 bits of the slow A/D data when the Coldfire DMA selects the slow A/D converters (see Low speed Analog section[R1]). A counter counts eight Coldfire reads and triggers a Slow FIFO IRQ interrupt upon completion of the eighth read.

Coldfire/Sharc Synchronization:

The following description only applies when interrupts are used to transfer data between the Slow ADC FIFO 28 and the Sharc 12. DMA mode is self-synchronizing and requires no synchronization procedure.

The Coldfire 14 and Sharc 12 low speed data captures must be in sync if their data is to match. Conditions such as the Coldfire and Sharc powering up at different times or a Coldfire reset command to the Sharc using the Reset TCV chip select can cause the Coldfire to be out of sync with the Sharc. If this happens, the Sharc data will be either corrupt or out of sync at best (the Coldfire data won't be affected by this condition).

The Coldfire 14 gets eight words of data from the low speed A/D converters every 32 $\mu$s. As explained above, the Sharc gets the same data using the Slow ADC FIFO Register 28. Care must be taken to insure that the data streams match. Observation of the Coldfire/Sharc interface bus has shown that the maximum transfer time for the eight slow A/D channels is about 7 $\mu$s. This leaves about 25 $\mu$s of idle time in each transfer cycle where synchronization can be safely accomplished.

One method of synchronizing the Sharc 12 and Coldfire 14 would be to use this idle time to clear the Slow ADC FIFO word counter during this idle time since this is the only time that Coldfire access is guaranteed not to be ongoing. The counter is cleared every time that the Slow ADC FIFO is read.

The sync method would proceed as follows:

Wait for a Slow ADC FIFO full condition by polling the Slow ADC FIFO full Bit. When this happens, the Coldfire is somewhere in it's 7 $\mu$s active DMA cycle, we just aren't sure where. All synchronizing activity has to occur in the 25 $\mu$s idle time in order for it to work. The optimum place to do the sync would be as quickly after we are sure that the Coldfire 14 is not actively acquiring data. Since the maximum time that it takes the Coldfire to acquire all data is 7 μs, if we add some margin and wait, say 15 μs, before we sync the FIFO, we'll guarantee that the next FIFO cycle will be in sync. Waiting 15 μs from a FIFO full condition will guarantee that the sync point will be at least 8 μs and at most 15 μs into the 25 μs idle time.

A timer could be used to measure this time and the timeout could be polled to determine when the timer expires. If a single FIFO read is done at this time, the FIFO counter will be cleared and will have to count to 8 before the next interrupt will occur. This synchronizes the Sharc 12 and Coldfire 14.

This is a rather tight time schedule and polling rather than a timer interrupt might be used to accomplish it.

If timer interrupts are usable for synchronizing the two processors, this will allow synchronization to occur on an ongoing basis every N cycles and will result in a more robust design than simply synchronizing once at reset.

Status Register 2 (48)

Register size: 16 bits:

Bits 15-11='0',

Bit 10=Threshold FIFO empty,

Bit 9=Threshold FIFO full,

Bit 8-5=Switchpoint register upper address bits,

Bit 4=transition direction (↑='1', ↓='0'),

Bits 3-0=least significant address nibble of threshold crossing point

Address=0x100000A

Read only

Note: This register 48 must always be read before the Threshold FIFO Register 58 or the Switch Point Register 56.

This register is used in combination with the Threshold FIFO Register 58 and Switch Point Register 56 to determine threshold crossings and memory switch points of the high-speed A/D converter data stream. As explained in the Threshold FIFO Register section, the Threshold FIFO is 21 bits wide. Bits 0 through 4 of this register contain the remainder of the data that could not fit in the Threshold FIFO Register. Bits 5 through 8 contain the address bits that couldn't fit in the Switch Point Register.

Bits 10 and 9 contain the status of the Threshold FIFO. Bit 4 contains a '1' if the transition of this entry in the Threshold FIFO was positive going and a '0' if negative going. Bits 3-0 contain the least significant nibble of the acquisition memory address of the transition point. These four least significant bits are combined with the 16 most significant address bits of the Threshold FIFO Register to form a 20-bit transition point address pointer into acquisition memory. This 20-bit address (normalized to a 15-word boundary) minus an offset to account for historical data can be written to the Acquire Memory Pointer Register to prepare for a read of the acquisition memory using the Acquire Memory Register.

This register must be read before the Threshold FIFO Register or an incorrect pointer address and status data may result.

Voltage Threshold Register (40)

Register size: 12 bits: differential mode; 11 bits: absolute mode

Address=0x100000B

Reset value: 0xFFF

Read/Write

This 12-bit register 40 contains the absolute value (always positive) of the voltage level required to enable each of the three Duration Threshold Register counters 60, 62, 64. In absolute mode (see DoDiff Bit), the incoming sampled data from the high-speed A/D converters is twelve bits wide so the absolute value of each data point will be 11 bits. If the absolute value of any word (adjusted to bipolar) read from the high-speed A/D converters exceeds the value in this register, the associated threshold counter for the data value will be incremented subject to the restrictions explained in the Duration Counter section. In absolute mode, this register 40 should never contain a positive number with more than 11 bits.

When in differential mode, this register 40 becomes a twelve bit register to account for the higher possible dynamic range of differential signals. The 12-bit positive number placed in this register is used as a threshold trigger point for the following three conditions:

Va−Vb,

Vb−Vc,

Vc−Va

If the absolute value of any of the three calculations exceeds the value in this register, the associated Duration Counter will be incremented as explained above.

Test DAC

An Analog Devices AD5324 four-channel test DAC (not shown) is included on the PC board for in-circuit test purposes and is accessible through Sharc serial port 1. It can be used for application development or as the stimulus for a complete end-to-end system test. Channel 1 of the DAC is connected to input voltage channel Va, channel 2 is connected to Vb, and channel 3 is connected to Vc at points just before the input amplifiers and after the input divide down resistors.

Because of this placement, all of the analog and digital acquisition circuitry can be tested with the DAC. The DAC is 12 bits wide and has a rise and fall time of about 0.7 V/us. Though this is relatively slow, it's adequate for in-circuit test purposes. When not active, it can be placed in its power down state. In this state, the outputs are tri-stated the TCV will acquire data from the divide down resistors without being affected by the DAC.

Temperature Sensor

An AD7814 temperature sensor (not shown) is also present on the PC board And can be accessed through Sharc serial port 0. It will be placed physically close to the high-speed A/D converters and can be used to monitor the temperature around the devices and make calibration adjustments if necessary.

High Speed Analog

Three A/D converters (ADC) 41 convert voltages from three channels into digital values. These values are sequentially read, preprocessed, and stored to acquisition memory by the ATCI chip.

The high-speed analog section of the TCV consists of three 12-bit A/D converters and associated buffering circuitry. The A/D converters provide voltage data to the system at a 15 Mhz data rate (three channels at 5 Mhz each). The data is read by the ATCI and written to acquisition memory.

Transient voltages of up to ±5000 volts peak can be provided to the digital circuitry.

Low Speed Analog

Two A/D converters (ADC) 41 convert four voltages and four currents into digital values. The outputs of these A/D converters go to both the Sharc 12 and Coldfire 14 processors so the same low speed data is available to each processor.

The low speed A/D converters used are the same as the present CV module. However, since bits 15 and 14 of the TCV are used as Coldfire signaling bits, the Coldfire software will change somewhat when the TCV module is used in place of the present CV module. In the present meter bit 13 is sign extended into bits 15 and 14. The TCV uses bits 15 and 14 as Coldfire signaling bits and therefore bit 13 is the only sign bit. When the Coldfire DMA reads the slow speed A/D converters, the TCV transmits the two Coldfire signaling bits (Signal Coldire Bit A and Signal Coldfire Bit B) directly from the Status Register to the Coldfire in bit positions 15 and 14 of the low speed ADC data.

The Sharc 12 and Coldfire 14 have access to the same low speed data (as long as the signaling rules are followed). The Sharc can therefore be used as a coprocessor in processing the 512 samples/sec data and thus offload the Coldfire if desired. Since the Sharc is a much more efficient numeric processor, this opens up many new applications that were not feasible if the Coldfire is the only processor available.

CPU

The central processor for the TCV module is the ADI Sharc DSP 12 (e.g., Analog Devices 21065). The CPU section includes of the Sharc 12, 256 Kbytes of field programmable flash memory, 4 Mbytes of DRAM, reset circuitry, and a temperature sensor.

CPU IO Flags

Flag 8—Watchdog Timer

This flag is attached to the external watchdog timer. If it isn't switched at least once per second, a hardware reset will occur.

Flag 9—Calibrate High Speed A/D Converters

This flag is attached to all three high-speed A/D converters and is used to calibrate them.

Flag 10—Request Interface FIFO Control

This CvownBus bit requests control of the Interface FIFO by writing a '0' to this bit. Writing a '0' requests Sharc control of the Interface FIFO. Writing a '1' will release control of the FIFO to the Coldfire whenever, but not until, the Coldfire requests control. Control of the Interface FIFO is determined by the status of the CvownBus bit.

Flag 11—Heartbeat LED

This flag is attached to a heartbeat LED. Writing a '0' turns the LED on.

Figure 3:
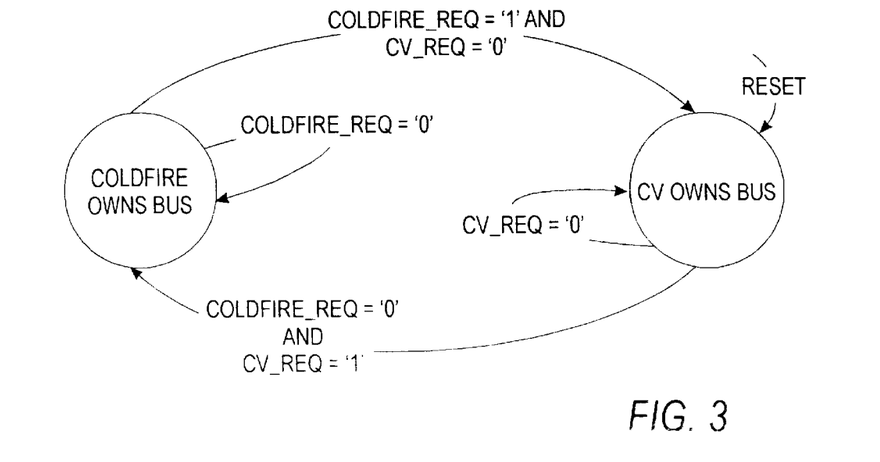
FIG. 3 is an Interface FIFO arbitration diagram.

Bus Interface FIFO Control Protocol (See FIG. 3)

An arbitration circuit on the main meter Digital Board determines whether the Sharc 12 or the Coldfire 14 has control of the Interface FIFO 18. The protocol each processor uses to request and get control of the FIFO is the same. From the standpoint of the Sharc the protocol is as follows:

Unless the Sharc has or is requesting control of the FIFO, it should maintain its Flag 10 bit high. The arbitration circuit has two active low request inputs: one from the Sharc and one from the Coldfire. If both are '1'. The state of the arbitration does not change. For example, if the Sharc just had control of the FIFO, and then sets its Flag 10 bit to '1, the state of the arbitration circuit remains the same (Sharc CVownBus bit stays high) so long as the Coldfire request bus control bit stays high. If, however, the Coldfire request bit is low when the Flag 10 bit is high, the arbitration circuit will grant control of the FIFO to the Coldfire and the Sharc's CVownBus Bit will go to '0'. At this point the Sharc cannot get control of the FIFO until the Coldfire sets it's request bit to '1'. Even if the Sharc request control by writing its Flag 10 bit low, the arbitration circuit will not allow it access until the Coldfire releases the FIFO by setting its request bit to '1'.

In summary, the rules for Sharc gaining control of the FIFO are as follows:

Request FIFO control by setting Flag 10 to '0',

Check the CVownsBus bus bit to see if it's '1',

If the CvownsBus bit is still '0', the Coldfire owns the FIFO and the Sharc has to wait for access If the CvownsBus bit is '1', then the Sharc is guaranteed fill read/write control of the FIFO no matter what the Coldfire does with its request line, When the Sharc is finished with the FIFO, set the Flag 10 bit to '1' to allow the Coldfire access to the FIFO.

The important things to remember about this procedure are to always verify that the Sharc has control of the bus by checking the CVownBus bit before reading or writing the FIFO. Requesting control of the FIFO does not necessarily mean that the arbitration circuit will grant control. Also, make sure that the Flag 10 request bit is set back to '1' when finished in order to allow the Coldfire to control the FIFO when necessary.

The above procedure describes how each processor gets control of the FIFO but doesn't describe how either of them knows whether there is valid data in the FIFO. An IfceFIFOempty bit is provided for this purpose. If this bit is '1' there is no data in the FIFO and the Sharc can assume that the Coldfire has no data to transmit. If the bit is '0' however, there is data in the FIFO that requires attention.

CPU Memory

The Shark 12 has direct access to a Flash memory (e.g., Atmel AT49LV002N12TI) (not shown), its own SDRAM memory (e.g., Hyundai HY57V161610D) (not shown), and indirect access to several other memory blocks through the ATCI. Below is a table of external memory addresses available to the Sharc:

TABLE 5

External Memory Map

| Description | Bus Width (bits) | Address Range |
|---|---|---|
| SDRAM | 32 | 0x0020000–0x03FFFFF |
| ATCI Chip | 16 | 0x1000000–0x100000B |
| Flash | 8 | 0x3000000–0x303FFFF |
| CPU Flash | | |
| 256Kx8, byte addressable | | |
| Chip select: MS3 | | |
| Address range: 0x3000000–0x303FFFF | | |
| Read/Write | | |

The operational code is stored in a 256K*8 field programmable flash. The TCV is set up to download this code at power up and any time there is a hard reset. The format of this code must conform to the rules in the Sharc documentation.

It's possible that a sector of this flash can be used for non-volatile data storage if necessary.

The flash is field programmable and can be accessed through Sharc memory select pin MS3.

CPU SDRAM

1M*32, long word addressable

Chip select: MS0

Address range: 0x0020000-0x03FFFFF

Read/Write

The Sharc has direct access to 4 Mbytes of SDRAM. This memory is available for both program and data storage.

Acquisition DRAM

2M*16, word addressable through the ATCI Chip

Read only

Acquired data is accessible through the Acquire Memory Register in the ATCI Chip 10. The address of the data to be accessed must first be loaded into the Acquire Memory Pointer.

Other components of the ATCI chip, shown in FIG. 1, are as follows:

The Threshold Calculation Control 66 does the control of the triggering algorithm. The ATCI continuously runs an algorithm to determine if a trigger point has occurred. This block runs the algorithm.

The Difference Circuit 82 box calculates the difference between the three incoming phases. This mode is used in the ATCI chip difference mode of operation and not used in absolute mode. Va–Vb, Vb–Vc, Vc–Va are calculated here.

The High Speed Data Pipes 84 1 through 4 are holding registers for the incoming data stream. Since it takes the ATCI multiple clock sycles to calculate trigger points, there has to be a place to store each data point while the calculation proceeds. When the ATCI completes its calculation, the result is matched with the data point that is currently in data pipe 4 and the result is written to acquire memory.

The Data Latch 86 is an internal latch for xynchronizing the data from the acquire memory to the Sharc bus timing.

The Acquire Address Counter 88 generates addresses for reading/writing the acquisition memory. These are the actual address lines that address the acquisition memory.

The Address Control Decoder 90 is the internal ATCI control block that selects different parts of the ATCI for reading or writing.

The Control block 92 is a generic block that signifies all of the various control circuitry in the chip that controls its various functions such as DRAM refresh, turning tri-state buffers on and off, various state machines, etc.

Some additional explanation of the other terms used herein follows:

Sharc addr is the Sharc address bus. 0x1000000 through 0x1000000b access different parts of the ATCI chip.

Sharc control are the Sharc control lines to the ATCI. They control reads, writes, chip selects, etc.

The ATCI uses absolute values to determine trigger points so that either positive and negative values will cause a trigger. The absolute value box 80 converts the incoming data to an absolute value used in the calculation.

The trigger IRQ is the interrupt that signals the Sharc that a valid trigger point has been reached. It is a single control line that runs from the ATCI to the Sharc.

The Interface FIFO register is the port at address 0x1000003 through which the Sharc communicates with the Coldfire using the Interface FIFO. Data written to this address goes into the 768 word Interface FIFO for later reads by the Coldfire. Reads of the port read data from the Interface FIFO that was previous Coldfire writes.

The Coldfire DMA is the means that the Coldfire uses to obtain what we call slow speed data from the low speed A/D converters. Rather than read the data directly, the Coldfire uses its direct memory access capability to read data from the A/D converters to its memory.

The ISR is an Interrupt Service Routine. A program in the microprocessor that runs when an interrupt occurs.

The acquire memory register is the port that reads the data in the acquisition memory. It is similar to the Interface FIFO register above but is read only.

The acquire memory MSW register is the most significant 16 bits of a 20 bit acquire memory address. Since the ATCI/Sharc interface bus is only 16 bits wide, the complete address must be stored in more than one register.

The flash memory is the non-volatile memory used to store the Sharc operational program. Each time the Sharc is either powered up or reset, the program is transferred from the flash to the Sharc SDRAM or the Sharc internal memory and executed.

The SDRAM (Synchronous Dynamic Random Access Memory) is one of the memories attached directly to the Sharc. Both data and programs are stored in this memory to be acted upon by the Sharc.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An impulsive transient detection and data acquisition apparatus for use with a power monitoring device having a processor for performing data sampling and reporting at a given rate, said apparatus comprising:

a processor;

an interface for accessing data from said processor;

a plurality of channels for monitoring for transients; and at least two independent, switchable memory banks for simultaneous real-time storage and analyses of an incoming transient data stream, said memory banks are responsive to commands from said processor for reversing said memory banks without data loss to allow long and/or multiple transients to be analyzed without loss of data.

2. An impulsive transient detection and data acquisition apparatus for use with a power monitoring device having a processor for performing data sampling and reporting at a given rate, said apparatus comprising:

a processor;

an interface for accessing data from said processor;

a plurality of channels for monitoring for transients;

a programmable voltage duration triggering mechanism for detecting transients on said plurality of channels; and at least two independent, switchable memory banks for simultaneous real-time storage and analyses of an incoming transient data stream said memory banks being responsive to commands from said processor for reversing said memory banks without data loss to allow long and/or multiple transients to be analyzed without loss of data.

3. An impulsive transient detection and data acquisition apparatus for use with a power monitoring device having a processor for performing data sampling and reporting at a given rate, said apparatus comprising:

a processor;

an interface for accessing data from said processor;

a plurality of channels for monitoring for transients;

at least two independent, switchable memory banks for simultaneous real-time storage and analyses of an incoming transient data stream; and a first in first out memory for communication with a power metering device processor.

4. The apparatus of claim 3 further including a threshold FIFO memory pointer register for storing transient information.

5. The apparatus of claim 4 and further including a first in first out memory for storing data read by said power monitoring device processor.

6. The apparatus of claim 3 and further including a first in first out memory for storing data read by said power monitoring device processor.

7. An impulsive transient detection and data acquisition apparatus for use with a power monitoring device having a processor for performing data sampling and reporting at a given rate, said apparatus comprising:

a processor;

an interface for accessing data from said processor;

a plurality of channels for monitoring for transients;

at least two independent, switchable memory banks for simultaneous real-time storage and analyses of an incoming transient data stream; and a threshold FIFO memory pointer register for storing transient information.

8. The apparatus of claim 7 and further including a memory device coupled with said threshold first in first out memory for storing data relating to multiple transient events.

9. An impulsive transient detection and data acquisition apparatus for use with a power monitoring device having a processor for performing data sampling and reporting at a given rate, said apparatus comprising:

a processor;

an interface for accessing data from said processor;

a plurality of channels for monitoring for transients;

at least two independent, switchable memory banks for simultaneous real-time storage and analyses of an incoming transient data stream; and a first in first out memory for storing data read by said power monitoring device processor.

10. A method of monitoring a power system to detect transient events, said monitoring method comprising:

accessing data from a processor;

monitoring for transients;

performing simultaneous real-time storage and analyses of an incoming transient data stream using at least two independent, switchable memory banks; and reversing said memory banks responsive to commands from said processor without data loss so as to allow multiple and/or long transients to be analyzed without loss of data.

11. A method of monitoring a power system to detect transient events, said monitoring method comprising:

accessing data from a processor;

monitoring for transients in a plurality of channels;

detecting transients on said plurality of channels using a programmable voltage and duration triggering mechanism;

performing simultaneous real-time storage and analyses of an incoming transient data stream using at least two independent, switchable memory banks; and reversing said memory banks responsive to commands from said processor without data loss so as to allow multiple and/or long transients to be analyzed without loss of data.

12. A method of monitoring a power system to detect transient events, said monitoring method comprising:

accessing data from a processor;

monitoring for transients;

performing simultaneous real-time storage and analyses of an incoming transient data stream using at least two independent, switchable memory banks; and communicating with a power metering device processor via a first in first out memory.

13. The method of claim 12 and further including storing transient information in a threshold first in first out memory.

14. The method of claim 13 and further including storing data read by said power monitoring device processor in a first in first out memory.

15. The method of claim 12 and further including storing data read by said power monitoring device processor in a first in first out memory.

16. A method of monitoring a power system to detect transient events, said monitoring method comprising:

accessing data from a processor;

monitoring for transients;

performing simultaneous real-time storage and analyses of an incoming transient data stream using at least two independent, switchable memory banks; and storing transient information in a threshold first in first out memory.

17. The method of claim 16 and further including storing data relating to multiple transient events in a memory device coupled with said threshold first in first out memory.

18. A method of monitoring a power system to detect transient events, said monitoring method comprising:

accessing data from a processor;

monitoring for transients;

performing simultaneous real-time storage and analyses of an incoming transient data stream using at least two independent, switchable memory banks; and storing data read by said power monitoring device processor in a first in first out memory.

19. An impulsive transient detection and data acquisition apparatus for use with a power monitoring device having a processor for performing data sampling and reporting at a given rate, said apparatus comprising:

means for processing data;

interface means for accessing data from said processing means;

means for monitoring for transients in a plurality of channels; and at least two independent, switchable memory means for simultaneous real-time storage and analyses of an incoming transient data stream said memory means being responsive to commands from said processor for reversing said memory means without data loss to allow long and/or multiple transients to be analyzed without loss of data.

20. An impulsive transient detection and data acquisition apparatus for use with a power monitoring device having a processor for performing data sampling and reporting at a given rate, said apparatus comprising:

means for processing data;

interface means for accessing data from said processing means;

means for monitoring for transients in a plurality of channels; and at least two independent, switchable memory means for simultaneous real-time storage and analyses of an incoming transient data stream, wherein said memory means being responsive to commands from said processor for reversing said memory means without data loss to allow long and/or multiple transients to be analyzed without loss of data.

21. An impulsive transient detection and data acquisition apparatus for use with a power monitoring device having a processor for performing data sampling and reporting at a given rate, said apparatus comprising:

means for processing data;

interface means for accessing data from said processing means;

means for monitoring for transients in a plurality of channels; and at least two independent, switchable memory means for simultaneous real-time storage and analyses of an incoming transient data stream, and a first in first out memory for communication with a power metering device processor.

22. The apparatus of claim 21 and further including a threshold first in first out memory for storing transient information.

23. The apparatus of claim 22 and further including a first in first out memory for storing data read by said power monitoring device processor.

24. The apparatus of claim 21 and further including a first in first out memory for storing data read by said power monitoring device processor.

25. An impulsive transient detection and data acquisition apparatus for use with a power monitoring device having a processor for performing data sampling and reporting at a given rate, said apparatus comprising:

means for processing data;

interface means for accessing data from said processing means;

means for monitoring for transients in a plurality of channels; and at least two independent, switchable memory means for simultaneous real-time storage and analyses of an incoming transient data stream, and a threshold first in first out memory for storing transient information.

26. The apparatus of claim 25 and further including a memory device coupled with said threshold first in first out memory for storing data relating to multiple transient events.

27. An impulsive transient detection and data acquisition apparatus for use with a power monitoring device having a processor for performing data sampling and reporting at a given rate, said apparatus comprising:

means for processing data;

interface means for accessing data from said processing means;

means for monitoring for transients in a plurality of channels; and at least two independent, switchable memory means for simultaneous real-time storage and analyses of an incoming transient data stream, a first in first out memory for storing data read by said power monitoring device processor.

* * * * *